US012399433B2

(12) United States Patent
Gu et al.

(10) Patent No.: US 12,399,433 B2
(45) Date of Patent: Aug. 26, 2025

(54) PROCESS, SYSTEM, AND SOFTWARE FOR MASKLESS LITHOGRAPHY SYSTEMS

(71) Applicant: Applied Materials, Inc., Santa Clara, CA (US)

(72) Inventors: Zheng Gu, Emeryville, CA (US); Yujiao Huang, Santa Clara, CA (US); Deepthy M. George, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 269 days.

(21) Appl. No.: 18/005,080

(22) PCT Filed: Jul. 29, 2020

(86) PCT No.: PCT/US2020/044029
§ 371 (c)(1),
(2) Date: Jan. 11, 2023

(87) PCT Pub. No.: WO2022/025879
PCT Pub. Date: Feb. 3, 2022

(65) Prior Publication Data
US 2023/0259038 A1    Aug. 17, 2023

(51) Int. Cl.
*G03F 7/00* (2006.01)
(52) U.S. Cl.
CPC .... *G03F 7/70508* (2013.01); *G03F 7/706835* (2023.05); *G03F 7/70775* (2013.01)
(58) Field of Classification Search
CPC .......... G03F 7/70508; G03F 7/706835; G03F 7/70775; G03F 7/70433; G03F 7/70525; G03F 7/2057; G03F 7/70291
See application file for complete search history.

(56) References Cited

U.S. PATENT DOCUMENTS

2006/0242618 A1* 10/2006 Wang ................. G03F 7/70441
716/52
2007/0023863 A1    2/2007 Radulescu
(Continued)

FOREIGN PATENT DOCUMENTS

CN    102331687 A    1/2012
CN    102629081 A    8/2012
(Continued)

OTHER PUBLICATIONS

PCT Notification of Transmittal of the International Search Report and the Written Opinion of the International Searching Authority for International Application No. PCT/US2020/044029; dated Apr. 27, 2021.
(Continued)

*Primary Examiner* — Hung V Nguyen
(74) *Attorney, Agent, or Firm* — Patterson + Sheridan, LLP

(57) ABSTRACT

Embodiments of the systems, methods, and software provided herein patterns substrates using digital lithography patterning controlled by field programmable gate arrays (FPGA). Stage position data is provided to the FPGA from the lithography environment and the data is loaded into a memory from the FPGA. The graphics processing unit, reads the data from the memory and calculates instructions based on the data. At least a portion of a substrate disposed on the stage is processed using instructions provided by the FPGA.

20 Claims, 5 Drawing Sheets

(56) References Cited

U.S. PATENT DOCUMENTS

| | | | |
|---|---|---|---|
| 2010/0248158 A1 | 9/2010 | Chen et al. | |
| 2015/0356214 A1* | 12/2015 | Arai | G03F 1/36 703/2 |
| 2016/0282728 A1 | 9/2016 | Johnston et al. | |
| 2020/0218064 A1 | 7/2020 | Büttner et al. | |
| 2023/0055090 A1* | 2/2023 | Teng | H01S 3/1003 |

FOREIGN PATENT DOCUMENTS

| | | |
|---|---|---|
| CN | 104267582 A | 1/2015 |
| CN | 104408759 A | 3/2015 |
| CN | 206322150 U | 7/2017 |
| JP | 2017-508172 A | 3/2017 |
| JP | 2017-151794 A | 8/2017 |
| JP | 2019-526820 A | 9/2019 |
| JP | 2020-003575 A | 1/2020 |
| KR | 10-2013-0026962 A | 3/2013 |
| KR | 10-2020-0016893 A | 2/2020 |
| WO | 2020/005718 A1 | 1/2020 |
| WO | 2020/055535 A1 | 3/2020 |

OTHER PUBLICATIONS

Japanese Office Action dated Mar. 26, 2024 for JP Application No. 2023-505460.
Office Action in related application 10-2023-7006448 dated Dec. 3, 2024.
Office Action in related application JP 2023-505460 dated Nov. 12, 2024.

* cited by examiner

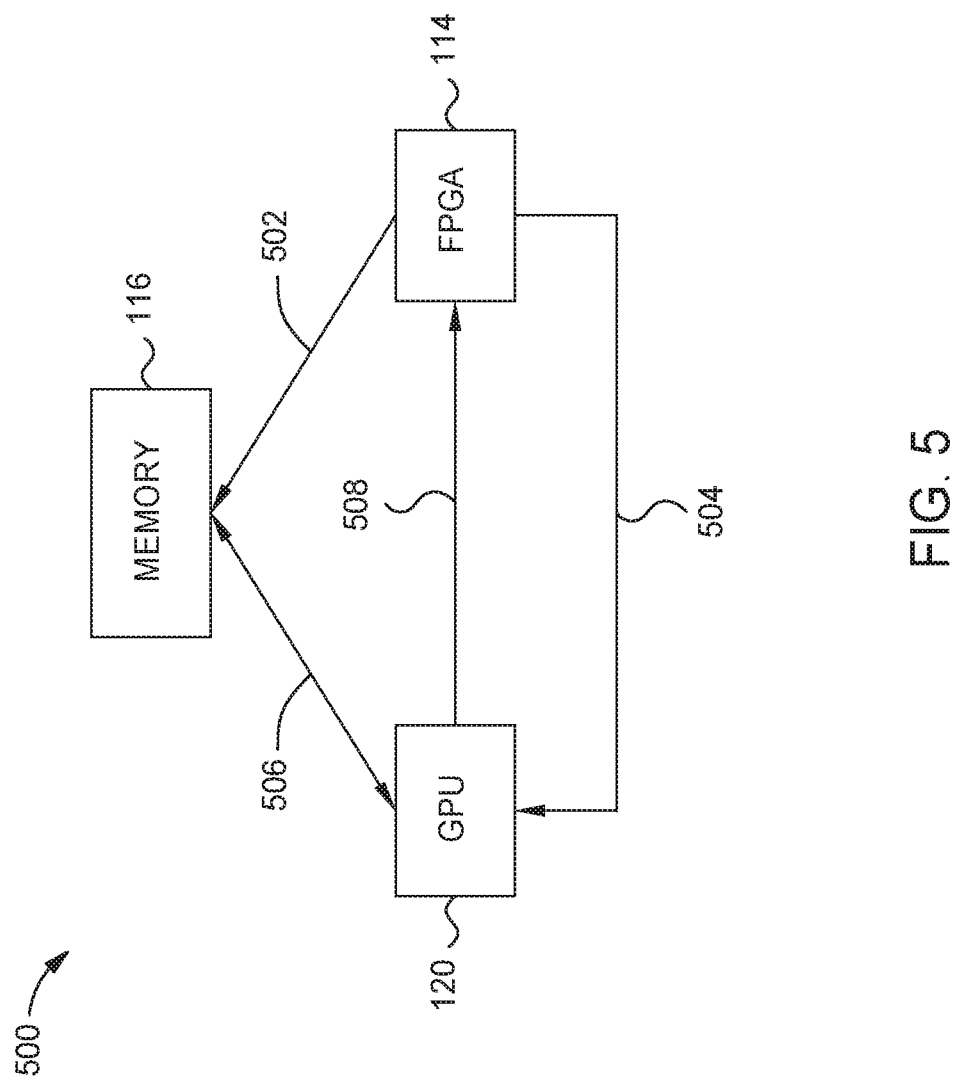

PROCESS, SYSTEM, AND SOFTWARE FOR MASKLESS LITHOGRAPHY SYSTEMS

CROSS-REFERENCE TO RELATED APPLICATIONS

This application is a national stage application under 35 U.S.C. 371 of PCT/US2020/044029, filed Jul. 29, 2020, which is hereby expressly incorporated by reference herein in its entirety as if fully set forth below and for all applicable purposes.

BACKGROUND

Field

Embodiments of the present disclosure generally relate to lithography systems. More particularly, embodiments of the present disclosure relate to a system, a software application, and a method of lithographic processing to update one or more of a mask pattern, maskless lithography device parameters, and lithography process parameters using a field programmed gate array (FPGA) and image process unit to direct a file readable by each of the components of the lithography environment.

Description of the Related Art

Maskless lithography is used in the manufacturing of semiconductor devices for displays, such as liquid crystal displays (LCDs), light emitting diode displays (LEDs), and the like. Large area substrates, such as flat panels may include a layer of liquid crystal material forming pixels sandwiched between two plates. When power from a power supply is applied across the liquid crystal material, an amount of light passing through the liquid crystal material is controlled by pixel locations enabling images to be generated. Microlithography techniques are employed to create electrical features incorporated as part of the liquid crystal material layer forming the pixels. According to this technique, a light-sensitive photoresist is applied to at least one surface of the substrate. Then, a pattern generator exposes selected areas of the light-sensitive photoresist as part of pattern with light to cause chemical changes to the photoresist in the selected areas to prepare the selected areas for subsequent material removal and/or material addition processes to create the electrical features.

In some digital lithography environments, the substrate is disposed on a moving stage of the lithography environment and is exposed to one or more optical projection modules. The moving stage can have position deviations which are taken into account to generate an image pattern that is used to control each pixel on a micro-mirror projection device used in the one or more optical projection modules. Real-time adjustments that are used have high amounts of geometry processing power, are costly, are less adaptable to varying pattern complexity, and are less adaptable to future upgrades.

Accordingly, what is needed in the art are an improved lithography environment and lithography processes.

SUMMARY

In one embodiment, a method is provided including receiving stage position data to a field programmable gate array (FPGA). The data is received into memory from the FPGA and a graphics processing unit (GPU), reads the data from the memory and computes an instruction based on the data. At least a portion of a substrate disposed on the stage is processed using instructions provided by the FPGA from the GPU.

In another embodiment, a non-transitory computer-readable medium storing instructions is provided that, when executed by a processor, cause a computer system to perform a method of patterning a substrate. The method includes receiving stage position data to a field programmable gate array (FPGA). The data is received into memory from the FPGA and a GPU reads the data from the memory and computes an instruction based on the data. At least a portion of a substrate disposed on the stage is processed using instructions provided by the FPGA from the GPU.

In another embodiment, a digital lithography system is provided that includes a processor, and a memory storing instruction which when executed by the processor performs a method for patterning of a substrate. The method includes sensing at least one attribute of a stage of a lithography system and inputting the at least one attribute to an FPGA. Data from the at least one attribute is loaded into a memory from the FPGA. The GPU reads the data from the memory and calculates a set of instructions based on the at least one attribute using the GPU. The at least a portion of a substrate disposed on the stage is patterned using instructions provided by the FPGA.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a schematic diagram of the communication flow between the memory, graphic processing unit (GPU), and field programmable gate array (FPGA) according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to lithography systems. More particularly, the present disclosure generally relate to methods of patterning substrates, including transmitting data into a field programmable gate array (FPGA) and loading the data into a memory from the FPGA. The data in the memory is readable by a graphics processing unit (GPU) and is used to calculate a mask characteristic which is used to provide instructions to the FPGA. The FPGA transmits the instructions to image projection systems which pattern the substrate. While the method, system, and software are described in the context of certain processes of a lithography environment such as mask patterning of substrates, the method, system, and software of the present disclosure are also applicable for other processing of digital lithography.

Figure 1:
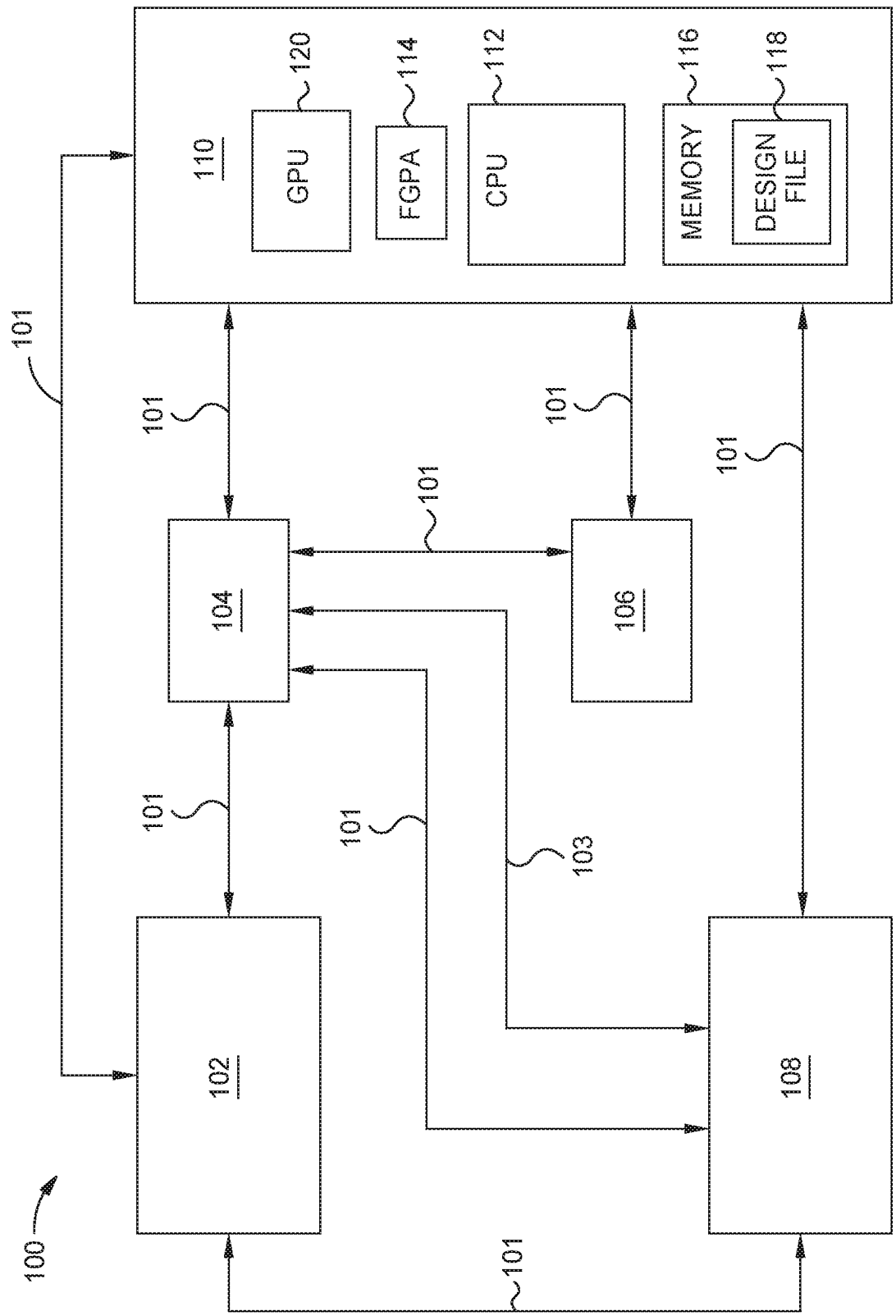
FIG. 1 is a schematic diagram of a lithography environment according to an embodiment described herein.

FIG. 1 is a schematic diagram of a lithography environment 100. As shown, the lithography environment 100 includes, but is not limited to, a virtual mask device 102, a metrology device 104, an assessment device 106, a maskless lithography device 108, a controller 110, a plurality of communication links 101, and a transfer system 103. Each of lithography environment devices is operable to be connected to each other via the communication links 101. Each of the lithography environment devices is operable to be connected to the controller 110 by the communication links 101. Alternatively or additionally, each of the lithography environment devices can communicate indirectly by first communicating with the controller 110, followed by the controller communicating with the lithography environment device in question. The lithography environment 100 can be located in the same area or production facility, or the each of the lithography environment devices can be located in different areas.

Each of the virtual mask device 102, the metrology device 104, the assessment device 106, the maskless lithography device 108, and controller 110 is indexed and includes an on-board processor and memory, where the memory is configured to store instructions. The communication links 101 include at least one of wired connections, wireless connections, satellite connections, and the like. The communications links 101 include sending and receiving files and/or data, according to embodiments further described herein. The communications links 101 can include temporarily or permanently storing files or data in the cloud, before transferring or copying the files or data to a lithography system tool.

The maskless lithography device 108 and the metrology device 104 are connected by the transfer system 103. The transfer system is operable to transfer a substrate between the maskless lithography device 108 and the metrology device 104. In one embodiment, which can be combined with other embodiments described herein, the transfer system 103 can include robots or other equipment connectable to the controller 110 operable to transfer patterned wafers. In one embodiment, which can be combined with other embodiments described herein, the transfer system 103 is physically operable by the user.

The controller 110 includes a central processing unit (CPU) 112, a graphics processing unit (GPU) and memory 116. The CPU 112 can be one of any form of computer processor that can be used in an industrial setting for controlling the lithography environment devices. The memory 116 is coupled to the CPU 112. The memory 116 can be one or more of readily available writable memory, such as random access memory (RAM). The controller 110 includes electronic circuitry, such as field-programmable gate arrays (FPGA) 114 which are used to receive information, such as stage position information, and send the information to compute into instructions readable by one or more processes of the lithography system, in order to perform aspects of the present disclosure. Although a single FPGA 114 is depicted, it is contemplated that more than one FPGA 114 is used for particular processes, such as a first FPGA communicatively coupled to a first lithography tool, such as a stage, and a second FPGA coupled to a second lithography tool, such as one or more image projection systems. Each FPGA is configured to control a real-time task. The controller 110 includes a graphics processing unit (GPU) 120, which includes hard/firmware capable of receiving data, executing user-defined program instructions on said data, and transmitting program results. Although a single GPU is depicted, it is contemplated that multiple GPUs can be communicatively coupled to an FPGA within a server via a bus, such as PCI Express. The GPU 120 is operated on a software platform, such as Radeon Open Compute Platform provided by Advanced Micro Devices Inc. (AMD ROCm), which runs on a Linux operating system. It is contemplated that other computing platforms and operating systems may be adapted in accordance with the embodiments described herein.

The memory 116 can include one or more software applications and stored media data that is used by the FPGA 114 to perform the methods described herein. The CPU 112 can be a hardware unit or combination of hardware units capable of executing software applications and processing data. A pure hardware controlled system requires customization that may not be very flexible in application. While a pure software controlled systems can lead to high latency in applications requiring high frequency, time dependent updates. As used herein, the term "latency" refers to the total time taken by a process less the time taken by the data-dependent portion (the algorithm) of that process, and is thus considered to be the time overhead of the process. In some implementations, heterogeneous processing systems are used, such as systems in which a GPU is used to offload and accelerate certain high frequency algorithms from the FPGA. The high latency of software controlled systems is attributed to the time it takes for the FPGA to notify the system software that new input data has been copied to the system RAM and is ready to be processed, the time it takes for the software to notify the GPU that a kernel (e.g., program and/or instruction) needs to be executed using the input data, and the time it takes for the GPU to execute the kernel.

Figure 2:
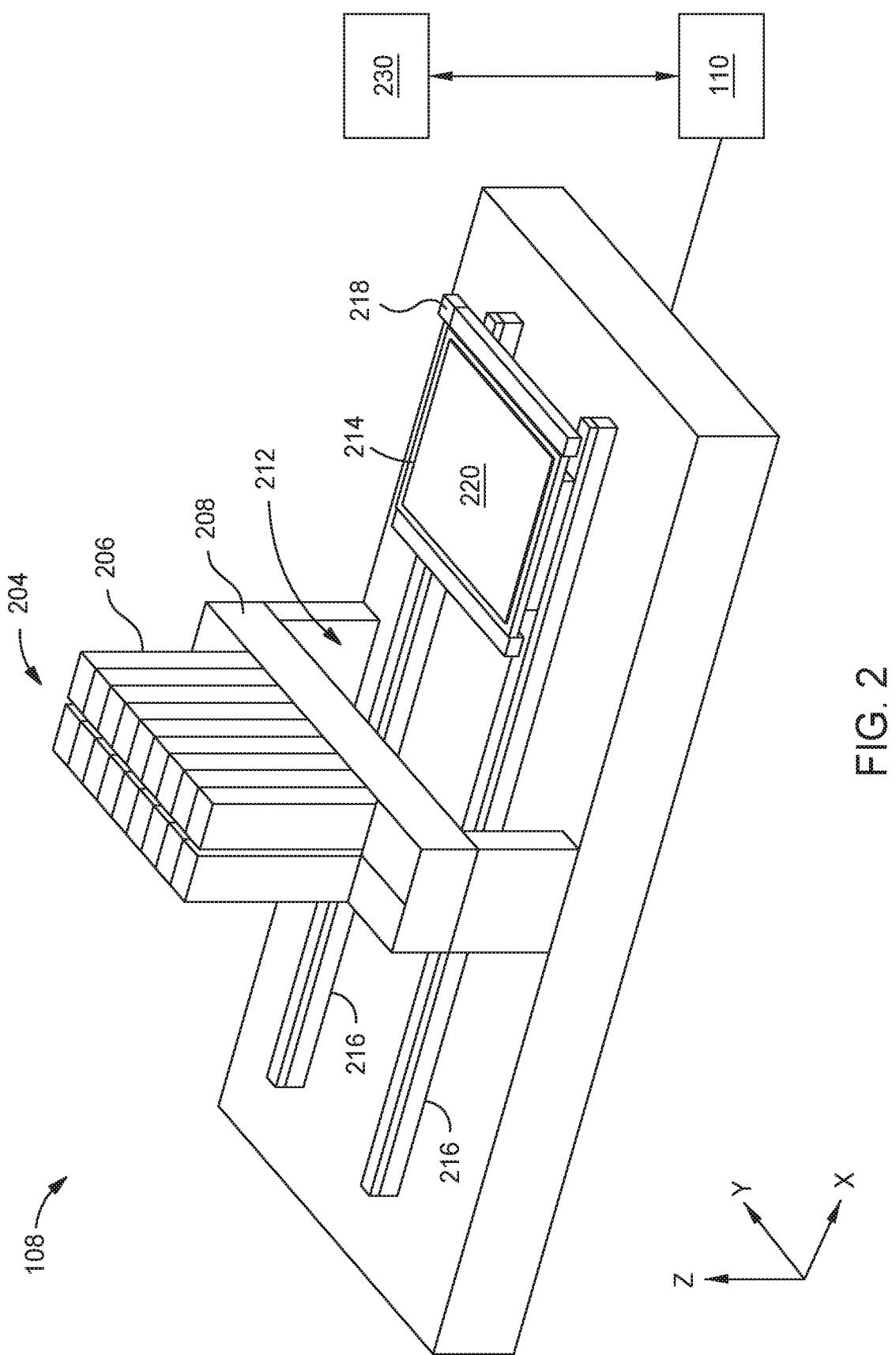
FIG. 2 is a perspective view of an exemplary maskless lithography device according to an embodiment described herein.

FIG. 2 is a perspective view of an exemplary maskless lithography device 108, such as a digital lithography system, that may benefit from embodiments described herein. The maskless lithography device 108 includes a stage 214 and a processing unit 204. The stage 214 is supported by a pair of tracks 216. A substrate 220 is supported by the stage 214. The stage 214 is operable to move along the pair of tracks 216. An encoder 218 is coupled to the stage 214 in order to provide information of the location of the stage 214 to a controller 110.

The controller 110 is designed to facilitate the control and automation of various process techniques. The controller 110 is coupled to or in communication with the processing unit 204, the stage 214, and the encoder 218. The processing unit 204 and the encoder 218 provide information to the controller 110 regarding the substrate processing and the substrate aligning. For example, the processing unit 204 provides information to the controller 110 to alert the controller 110 that substrate processing has been completed. The controller 110 facilitates the control and automation of a maskless lithography process based on a design file provided by the interface 230. The design file (or computer instructions), which is referred to as an imaging design file, readable by the controller 110, determines which tasks are to be performed on a substrate. The design file 118 includes mask pattern data. The mask pattern data includes a mask pattern and code to monitor and control the processing time and substrate position. The mask pattern corresponds to a pattern to be written into the photoresist using electromagnetic radiation.

The substrate 220 is fabricated from or includes any suitable material, for example, glass, which is used as part of a flat panel display. In other embodiments, which can be combined with other embodiments described herein, the substrate 220 is made of other materials capable of being used as a part of the flat panel display, alternatively, the substrate 220 is made of materials capable of being used as part of an advanced packaging application, such as chip packaging. The substrate 220 has a film layer to be patterned formed thereon, such as by pattern etching thereof, and a photoresist layer formed on the film layer to be patterned, which is sensitive to electromagnetic radiation, for example ultraviolet (UV) or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing unit 204 is supported by the support 208 such that the processing unit 204 straddles the pair of tracks 216. The support 208 provides an opening 212 for the pair of tracks 216 and the stage 214 to pass under the processing unit 204. The processing unit 204 is a pattern generator configured to receive the mask pattern data from the interface 230 and expose the photoresist in the maskless lithography process using one or more image projection systems 206 operable to project write beams of electromagnetic radiation to the substrate 220. The pattern generated by the processing unit 204 is projected by the image projection systems 206 to expose the photoresist of the substrate 220 to the mask pattern that is written into the photoresist. During operation, one of the stages 214 moves in the X-direction from a loading position to a processing position. The processing position refers to one or more positions of the stage 214 as the stage passes under the processing unit 204. Each stage 214 is capable of moving in the Y-direction by moving along a track for processing and/or indexing the substrate.

In one embodiment, which can be combined with other embodiments described herein, each image projection system 206 includes a spatial light modulator to modulate the incoming light to create the desired image. Each spatial light modulator includes a plurality of electrically addressable elements that are controlled individually. Each electrically addressable element may be in an "ON" position or an "OFF" position based on the mask pattern data and corrections provided by positional correction models. When the light reaches the spatial light modulator, the electrically addressable elements that are in the "ON" position project a plurality of write beams to a projection lens (not shown). The projection lens then projects the write beams to the substrate 220. The electrically addressable elements include, but are not limited to, digital micromirrors, liquid crystal displays (LCDs), liquid crystal over silicon (LCoS) devices, ferroelectric liquid crystal on silicon (FLCoS) devices, microshutters, microLEDs, vertical cavity surface emitting lasers (VCSELs), liquid crystal displays (LCDs), or any solid state emitter of electromagnetic radiation.

The mask pattern data includes the mask pattern having one or more polygons corresponding to portions of the photoresist to be exposed to electromagnetic radiation projected by the processing unit 204. It is to be understood that any shaped polygons could be used as the one or more polygons, such that exposed portions form one or more different features in the photoresist.

Figure 3:
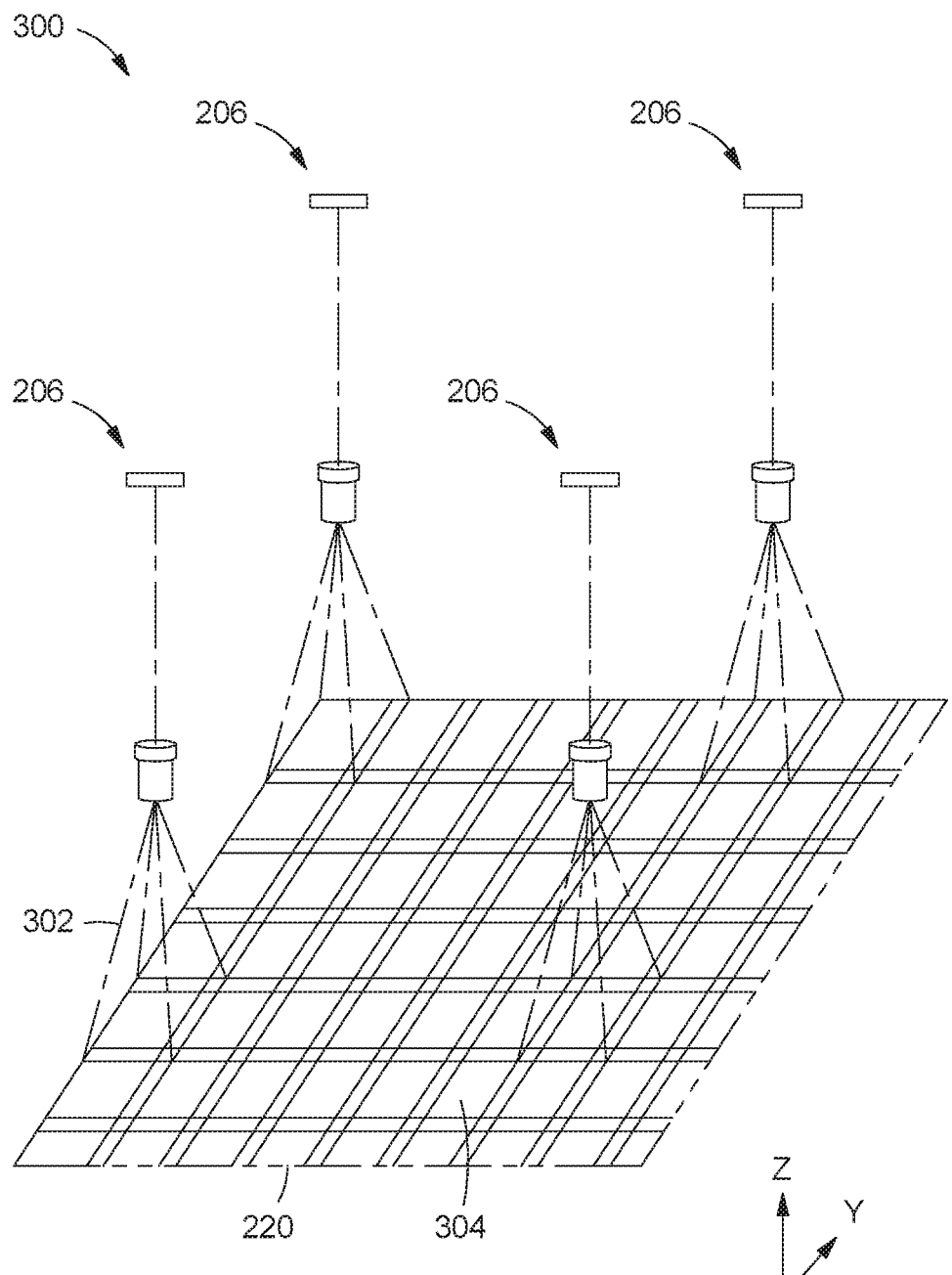
FIG. 3 is a schematic view of a plurality of image projection systems according to an embodiment described herein.

FIG. 3 is a schematic view of a lithography system 300 having a plurality of image projection systems 206. It is to be understood that although the lithography system 300 is depicted as having four image projection systems 206, it is contemplated that other arrangements and/or image projection systems may be used either in place of or in addition to the image projection systems 206 shown in FIG. 3. In operation, each image projection system 206 produces a plurality of write beams 302 onto a surface 304 of the substrate 220. As the substrate 220 moves in the X-direction and/or the Y-direction, as indicated by the coordinate system in FIG. 3, the surface 304 (e.g., an entire surface across a substrate 220 from edge to edge) is patterned by the write beams 302. In various embodiments, the number of image projection systems 206 included in the system varies based on factors such as the size of the substrate 220 and/or the speed of the stages 214 (as shown in FIG. 2).

Each image projection system 206 is tuned individually for each localized area of the substrate that is patterned in real time in order to achieve pattern uniformity on the substrate. Hierarchical mask data is converted to a flat format by a software program embodied within or in communication with the system 300. The flattened mask data is further processed and used with an arrayed parallel imaging writer system to produce high quality images. For the arrayed parallel imaging writer system, the mask data structure is flattened and partitioned into pieces of a predefined size to properly and evenly feed to each image projection system 206. The mask data structure includes information that indicates the placement for each piece of mask data relative to its respective image projection system 206. Moreover, the mask data structure includes information that specifies how features that span multiple image projection systems 206 will be divided among them. The data placement tuning is recognized via the mask data structure that is related to the adjacent mask data areas from the image projection systems 206. Mask patterning is overlapped between adjacent image projection systems 206 in order to blend around patterning borders. Each partitioned mask data pattern is fed to its corresponding image projection system and portions of the substrate is patterned in one of several possible methods. Each method is selected based on the substrate, predetermined final device, predetermined throughput, and other considerations. At the borders between adjacent substrate portions, micro-mirror pixels are used to correct overlap portions or to correct other portions of the pattern. The correction algorithm uses high frequency position data of the stage 214 provided by the encoder 218 and sends correction factors to each corresponding image projection system 206. The correction factors can be different depending on the relative imaging locations on the substrate. The correction factors can be detected and timed to be used by the image projection system 206 by the time the stage reaches a predetermined position at which correction is applied.

Methods for tuning data for parallel image processing includes writing beams onto a surface of the substrate, and, as the substrate moves in the X-direction and Y-direction, the entire surface is patterned by the write beams of image projection systems 206. During patterning the controller 110 processes one or more graphical objects of the surface of the substrate. The processing of the graphical objects generates and/or partitions the one or more graphical objects into a plurality of convex polygons. To facilitate parallel image processing acceleration, the polygons are tessellated into convex polygons, such as convex quadrilaterals and/or triangles. The tessellation occurs along the scan direction. The tessellation of the polygons to convex quadrilaterals, a lower level primitive, simplify a second stage of the patterning process, rasterization. The rasterization process uses the geometric data from the tessellation process and stage position data from the encoder 218 to microscopically shift the pattern before converting the data to instructions readable by the image projection system 206.

Figure 4:
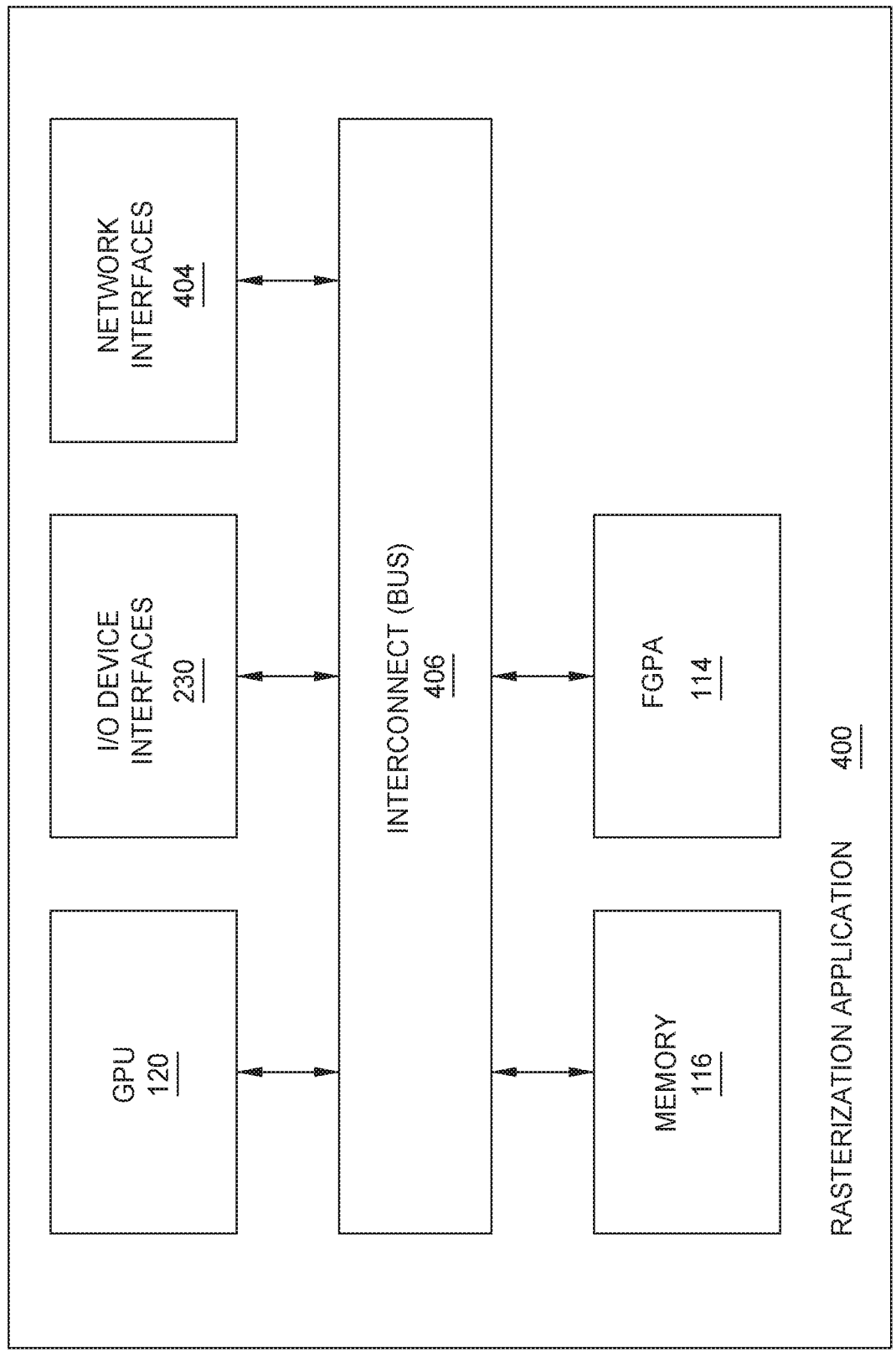
FIG. 4 is a schematic diagram of a computer system for providing a rasterization application according to an embodiment described herein.

FIG. 4 is a schematic diagram 400 of a computer system for providing a rasterization application. The rasterization application includes, without limitation, the GPU 120, I/O device interfaces 230 configured to connect I/O device, a network interface 404 configured to transmit data via a communications network, memory 116, the FPGA 114, communicating via an interconnect 406, such as a PCI Express bus within a CPU ASIC. The ROCm and custom driver software are run within the operating system.

FIG. 5 is a schematic diagram 500 of the communication flow between the memory 116, GPU 120, and FPGA 114 according to an embodiment described herein. Mask pattern data is input by a user into the interface 230. The mask pattern data includes image data such as a design file 118. The design file 118 is typically loaded into memory prior to processing of the substrate. Once the design file 118 is loaded, the substrate is processed, as described with reference to FIG. 2 and FIG. 3. The encoder 218 retrieves information on the position of the stage during processing and the position data is sent to the FPGA 114 in real-time and in high frequency (e.g., 502).

The stage position data is copied to the memory 116, and the FPGA 114 notifies the GPU 120, that the data is available for the rasterization algorithm to be executed (e.g., 504). This functionality is enabled by ROCm, which provides a virtual memory address of a GPU register (e.g., "doorbell"). ROCm includes an AMD driver used to control the GPU 120. The virtual memory address of the GPU register refers to a location within the GPU 120. The ROCm platform is capable of executing algorithms of the GPU 120 in real-time during substrate processing using input data from the FPGA 114. The ability to execute the GPU 120 in real-time directly from FPGA 114 input uses hardware control which is enabled by a driver. The driver, is a software that interacts with an operating system, such as Linux, and communicates directly with the hardware (e.g., FPGA 114). In particular, the driver uses the virtual memory address provided by the ROCm and determines the physical memory address which is then programmed to the FPGA 114. The physical memory address refers to a bus address within an electronic data connection (e.g., interconnect 406) among the GPU 120, FPGA 114, and memory 116, which is used for communication. In some embodiments, which can be combined with other embodiments described herein, the bus is PCI Express. It has been found that coding the driver, to reveal the physical address of the doorbell enables writing of the register from the FPGA 114 rather than the ROCm software.

The driver software enables the FPGA 114 to write directly to the GPU register and GPU 120 uses the data to execute a kernel (e.g., program and/or instruction) (e.g., 506). Without the use of the driver, the process would rely on software to synchronize the reception of input data from the FPGA 114 with the initialization of the GPU algorithm. In a kernel launch for a lithography system such as the lithography system described herein, the GPU instruction code is loaded before any real-time processes. Consequently, for each launch, real-time sensor data from the FPGA 114 is transferred to system memory (RAM), and the FPGA 114 starts GPU code execution using this data as input arguments. As part of its execution, the GPU reads the input arguments from RAM, performs calculations to provide a program or instructions, and transfers output results back to the FPGA 114 (e.g., 508). The FPGA 114 delivers the output which includes instructions to control each image projection system 206.

Although the methods of the present disclosure are described with reference to receiving data and outputting instructions for rasterization applications, it is also contemplated that other applications using high frequency, low latency data could benefit from the present disclosure. In some embodiments, which can be combined with other embodiments described herein, the method includes sensing at least one attribute of a stage of a lithography system and inputting the at least one attribute to an FPGA. The at least one attribute is loaded into a memory from the FPGA and the attribute is read from the memory by the GPU. The GPU calculates a set of instructions based on the at least one attribute. The lithography device uses the set of instructions from the FPGA to pattern at least a portion of a substrate disposed on the stage. It has been found that processes and/or attributes less sensitive to timing of execution and/or large in file size can be adequately initiated and/or controlled by software, while other processes and/or attributes such as those described herein are improved using GPU computing which is initiated using FPGA control. GPU computing described herein is useful for high throughput, latency-sensitive processes such as a rasterization process.

A latency maximum of the process described herein is about 7200 ns to about 8000 ns, such as about 7500 ns. In comparison, a maximum latency using low-latency polling methodology is about 17000 ns. Removing software control and developing a driver to enable direct communication of the FPGA with the GPU for computations utilized for the lithography system reduces the expected latency range of the FPGA as well as the maximum latency. Embodiments of the disclosure also reduce the likelihood of occasional prolonged latency (e.g., max latency) during digital lithography. This consideration is beneficial for operations where the output is timed with parallel executed process that cannot be paused.

For digital lithography, each execution of the GPU algorithm is completed within 100 µs to produce adequate productivity. The total latency of the methods described herein is below about 7.5 µs for the rasterization application, which is a small fraction of the total throughput budget. An example design file was used to compare the upper geometry computation time for a particular design file.

Software control is deficient for such systems because the software is notified when the FPGA writes to memory, which adds latency to the process. Software notification can be a process of checking for updates periodically (polling) or an interrupt-based notification which can add to occasional latency issues. Removing occasional latency issues reduces processing failures and improves device throughput.

Embodiments described herein further relate to a non-transitory computer-readable medium storing instructions that, when executed by a processor, cause a computer system to perform a method including inputting mask pattern data having a plurality of exposure polygons to an FPGA of a digital lithography system and loading the mask pattern data into a memory from the FPGA. The FPGA notifies a graphics processing unit of the mask pattern data loaded into the memory and uses data from a plurality of image projection systems that receive the mask pattern data. Each image projection system corresponds to a first portion of a first substrate and receives an exposure polygon dataset corresponding to the first portion. The graphics processing unit reads the mask pattern data from the memory and provides instructions to the FPGA to pattern at least the first portion of the first substrate using the plurality of image projection systems.

In summation, a method is provided including providing data from a sensor into a field programmable gate array (FPGA). The data is loaded into a memory from the FPGA and a graphics processing unit, reads the data from the memory and computes a set of instructions based on the data. At least a portion of a substrate disposed on the stage is processed using instructions provided by the FPGA.

The invention claimed is:

1. A method of patterning a substrate, comprising:
   providing data from a lithography system to a field programmable gate array (FPGA);
   loading the data into a memory from the FPGA;
   computing the data from the memory by a graphics processing unit (GPU);
   providing instructions to the FPGA from the data from the GPU; and
   patterning at least a portion of a substrate disposed on a stage using the instructions provided by the FPGA.

2. The method of claim 1, further comprising positioning the substrate on the stage of the lithography system before patterning the portion of the substrate.

3. The method of claim 1, further comprising reading a position of the stage from an encoder, wherein the data comprises the position of the stage.

4. The method of claim 1, wherein the FPGA and the GPU are communicatively coupled to send and receive the data to one another.

5. The method of claim 1, wherein patterning the at least the portion of the substrate comprises providing instructions to one or more image projection systems.

6. The method of claim 1, further comprising determining a physical memory address based on a virtual memory address of a GPU register of the GPU using a driver software.

7. The method of claim 6, further comprising programming the physical memory address to the FPGA.

8. The method of claim 6, wherein the virtual memory address is provided by an open source software.

9. The method of claim 6, further comprising writing directly to the physical memory address using the data input from the FPGA.

10. The method of claim 1, wherein the GPU is operated on a software platform, wherein the software platform and a custom driver is run on an operating system.

11. The method of claim 1, wherein a maximum time between sending a kernel execution request from the FPGA and receiving an instruction from the GPU is 8000 ns.

12. The method of claim 1, wherein the memory is random access memory.

13. A non-transitory computer-readable medium storing instructions that, when executed by a processor, cause a computer system to perform the steps of:
   providing data from a lithography system to a field programmable gate array (FPGA);
   loading the data into a memory from the FPGA;
   computing the data from the memory by a GPU;
   providing instructions to the FPGA from the data from the GPU; and
   patterning at least a portion of a substrate disposed on a stage using the instructions provided by the FPGA.

14. The non-transitory computer-readable medium of claim 13, wherein computing the data further comprises forming an actual grid map comprising actual image locations on the substrate.

15. The non-transitory computer-readable medium of claim 14, further comprising comparing the actual grid map to a grid model and determining a correction factor for patterning the substrate.

16. The non-transitory computer-readable medium of claim 13, wherein the processor synchronizes movements of image projection systems with movement of the stage during patterning.

17. The non-transitory computer-readable medium of claim 13, wherein the FPGA and the GPU are communicatively coupled to send and receive the data to one another.

18. The non-transitory computer-readable medium of claim 13, further comprising:
   determining a position of the stage of the lithography system; and
   calculating a mask image correction to be written on the portion of the substrate based on the data.

19. A digital lithography system comprising:
   a processor; and
   a memory storing instruction which when executed by the processor perform a method for patterning of a substrate, the method comprising:
      sensing at least one attribute of a stage of a lithography system;
      inputting the at least one attribute to an FPGA;
      loading the at least one attribute into a memory from the FPGA;
      reading the at least one attribute from the memory by a GPU;
      calculating a set of instructions based on the at least one attribute using the GPU; and
      patterning at least a portion of a substrate disposed on the stage using the instructions provided by the FPGA.

20. The system of claim 19, wherein the at least one attribute is a position of the stage.

* * * * *